United States Patent
Noh et al.

(10) Patent No.: US 10,097,206 B2
(45) Date of Patent: Oct. 9, 2018

(54) METHOD AND APPARATUS FOR PERFORMING ENCODING USING BLOCK CODE HAVING INPUT/OUTPUT OF VARIABLE LENGTH

(71) Applicant: ELECTRONICS AND TELECOMMUNICATIONS RESEARCH INSTITUTE, Daejeon (KR)

(72) Inventors: Taegyun Noh, Daejeon (KR); Hyukjun Oh, Seoul (KR); Sung Cheol Chang, Daejeon (KR); Jihoon Choi, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 27 days.

(21) Appl. No.: 15/283,398

(22) Filed: Oct. 1, 2016

(65) Prior Publication Data

US 2017/0099066 A1 Apr. 6, 2017

(30) Foreign Application Priority Data

Oct. 1, 2015 (KR) .......................... 10-2015-0138664
Sep. 28, 2016 (KR) .......................... 10-2016-0125077

(51) Int. Cl.
*H03M 13/13* (2006.01)
*H03M 13/29* (2006.01)
*H04L 1/00* (2006.01)

(52) U.S. Cl.
CPC ..... *H03M 13/136* (2013.01); *H03M 13/2906* (2013.01); *H04L 1/0057* (2013.01)

(58) Field of Classification Search
CPC .... H03M 13/09; H03M 13/29; H03M 13/136; H03M 13/2906; H03M 13/15; H03M 13/45; H04L 1/0041; H04L 1/0057; H04L 1/0068; H04L 1/1812
See application file for complete search history.

(56) References Cited

U.S. PATENT DOCUMENTS

| | | | |
|---|---|---|---|
| 7,158,635 B2 * | 1/2007 | Dick | H04L 1/0041 380/28 |
| 7,581,155 B2 | 8/2009 | Lee et al. | |
| 7,721,179 B2 * | 5/2010 | Kim | H04L 1/0041 714/755 |

(Continued)

FOREIGN PATENT DOCUMENTS

KR 10-2004-0085545 A 10/2004

OTHER PUBLICATIONS

3GPP TS 36.212 V12.4.0 (Mar. 2015).
Taegyun Noh et al., "A Study on the variable length Reed Muller code designs", vol. 58 No. 01 pp. 0618-0619 (Nov. 2015).

*Primary Examiner* — Shelly A Chase
(74) *Attorney, Agent, or Firm* — Rabin & Berdo, P.C.

(57) ABSTRACT

There are provided an encoding method and an encoder performing an encoding by an operation of generating a first output message by encoding an input message based on a first block code, an operation of generating a second output message by encoding some of the input message based on a second block code, and an operation of concatenating the first output message and the second output message.

12 Claims, 5 Drawing Sheets

(56) References Cited

U.S. PATENT DOCUMENTS

| | | | |
|---|---|---|---|
| 8,386,879 B2* | 2/2013 | Djordjevic | H03M 13/1174 714/752 |
| 8,488,648 B2 | 7/2013 | Lim et al. | |
| 2004/0193995 A1 | 9/2004 | Park et al. | |
| 2006/0200706 A1 | 9/2006 | Lamy | |
| 2011/0243278 A1* | 10/2011 | Cheng | H03M 13/136 375/340 |
| 2014/0157091 A1 | 6/2014 | Yu et al. | |
| 2015/0009952 A1* | 1/2015 | Berggren | H04W 72/042 370/330 |
| 2016/0065345 A1* | 3/2016 | Kim | H04W 72/0406 370/330 |

* cited by examiner

FIG. 1

| j | Mi,0 | Mi,1 | Mi,2 | Mi,3 | Mi,4 | Mi,5 | Mi,6 | Mi,7 | Mi,8 | Mi,9 | Mi,10 |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

FIG. 2

| i | Mi,0 | Mi,1 | Mi,2 | Mi,3 | Mi,4 | Mi,5 | Mi,6 | Mi,7 | Mi,8 | Mi,9 | Mi,10 |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |
| 32 | 0 | 0 | 0 | 0 | 0 | 0 | 0 | 0 | 1 | 0 | 0 |
| 33 | 0 | 0 | 0 | 0 | 0 | 0 | 0 | 0 | 1 | 0 | 1 |
| 34 | 0 | 0 | 0 | 0 | 0 | 0 | 0 | 0 | 1 | 1 | 0 |
| 35 | 0 | 0 | 0 | 0 | 0 | 0 | 0 | 0 | 1 | 1 | 1 |

METHOD AND APPARATUS FOR PERFORMING ENCODING USING BLOCK CODE HAVING INPUT/OUTPUT OF VARIABLE LENGTH

CROSS-REFERENCE TO RELATED APPLICATION

This application claims priority to and the benefit of Korean Patent Application Nos. 10-2015-0138664 and 10-2016-0125077 filed in the Korean Intellectual Property Office on Oct. 1, 2015, and Sep. 28, 2016, the entire contents of which are incorporated herein by reference.

BACKGROUND OF THE INVENTION (a) Field of the Invention

The present invention relates to a method and an apparatus for performing an encoding using a block code having an input/output (I/O) of a variable length.

(b) Description of the Related Art

An error correcting code of a communication system is additional information having a correlation with message information. A transmitter may couple the message information to the additional information having the correlation with the message information and then transmit the coupled information, and a receiver may restore original message information through the coupled additional information from the entire message in which error exists.

A block code is a kind of error correcting codes, and in the case in which the block code is used, an encoding and a decoding may be performed in a block unit. In the block code, a length of an input message which becomes a target of the encoding and a length of a final message which is output after the encoding are fixed to predefined values to thereby configure one block. For example, a (n, k) block code has the length of the input message of k and the length of the output message of n. In this case, n is greater than k, a portion corresponding to a length of n−k is the additional information with the correlation with the input message information, and error correcting capability may be assigned to the output message through the additional information. As the length of the additional information is longer, it is possible to sense and correct more errors.

SUMMARY OF THE INVENTION

The present invention has been made in an effort to provide an encoder and a decoder having advantages of encoding and decoding a message based on a code which is optimally designed using a concatenating of two Reed-Muller codes.

The present invention has been made in an effort to provide a method having advantages of encoding and decoding a message based on a code which is optimally designed using a concatenating of two Reed-Muller codes.

An exemplary embodiment of the present invention provides an encode encoding a message. The encoder includes a processor and a memory, wherein the processor executes a program stored in the memory to perform an operation of generating a first output message by encoding an input message based on a first block code, an operation of generating a second output message by encoding some of the input message based on a second block code, and an operation of concatenating the first output message and the second output message, wherein the first block code is a block code having a length of an output message of $2^n$, and the second block code is a Reed-Muller code having a length of an output message of $2^m$, m being smaller than n.

The block code having a length of an output message of $2^n$ may be a (32, A) bcode of long term evolution (LTE) system, and the Reed-Muller code having a length of an output message of $2^m$ may be a (4, 3) Reed-Muller code.

The some of the input message may be a portion corresponding to a length from a final bit of the input message to the input message of the second block code.

When the processor performs the operation of generating the second output message, the processor may perform an operation of encoding the input message using some of the second block code, when a length of the input message is shorter than a length of an input message of the second block code.

The some of the second block code may be a dual orthogonal code which remains after deleting a right column of the second block code.

Another embodiment of the present invention provides a method for encoding a message. The method includes generating a first output message by encoding an input message based on a first block code, generating a second output message by encoding some of the input message based on a second block code, and concatenating the first output message and the second output message, wherein the first block code is a block code having a length of an output message of $2^n$, and the second block code is a Reed-Muller code having a length of an output message of $2^m$, m being smaller than n.

The block code having a length of an output message of $2^n$ may be a (32, A) block code of long term evolution (LTE) system, and the Reed-Muller code having a length of an output message of $2^m$ may be a (4, 3) Reed-Muller code.

The some of the input message may be a portion corresponding to a length from a final bit of the input message to the input message of the second block code.

The generating of the second output message may include encoding the input message using some of the second block code, when a length of the input message is shorter than a length of an input message of the second block code.

The some of the second block code may be a dual orthogonal code which remains after deleting a right column of the second block code.

Yet another embodiment of the present invention provides a decoder decoding a message. The decoder includes a processor and a memory, wherein the processor executes a program stored in the memory to perform an operation of generating a first output message by decoding a received message based on a fast Walsh-Hadamard transform (FWHT), an operation of calculating a correlation value of a code originated from a dual orthogonal code and some of the received message, and an operation of mapping the first output message and the correlation value.

When the processor performs the operation of generating the first output message, the processor may perform an operation of applying the FWHT to branches having the number corresponding to bits exceeding a predefined length, when the received message is longer than the predefined length.

The encoder and the decoder of the first Reed-Muller code having the length of the existing output message of 2n which is optimally designed, and the encoder and the decoder of the second Reed-Muller having the length of the output message which is shorter than 2n are utilized as it is, thereby making it possible to efficiently design the optimal code having the maximum hamming distance.

BRIEF DESCRIPTION OF THE DRAWINGS

FIG. 1 is a diagram illustrating a (32, A) Reed-Muller code.

FIG. 2 is a diagram illustrating a (36, A) Reed-Muller code according to an exemplary embodiment of the present invention.

DETAILED DESCRIPTION OF THE EMBODIMENTS

Figure 3:
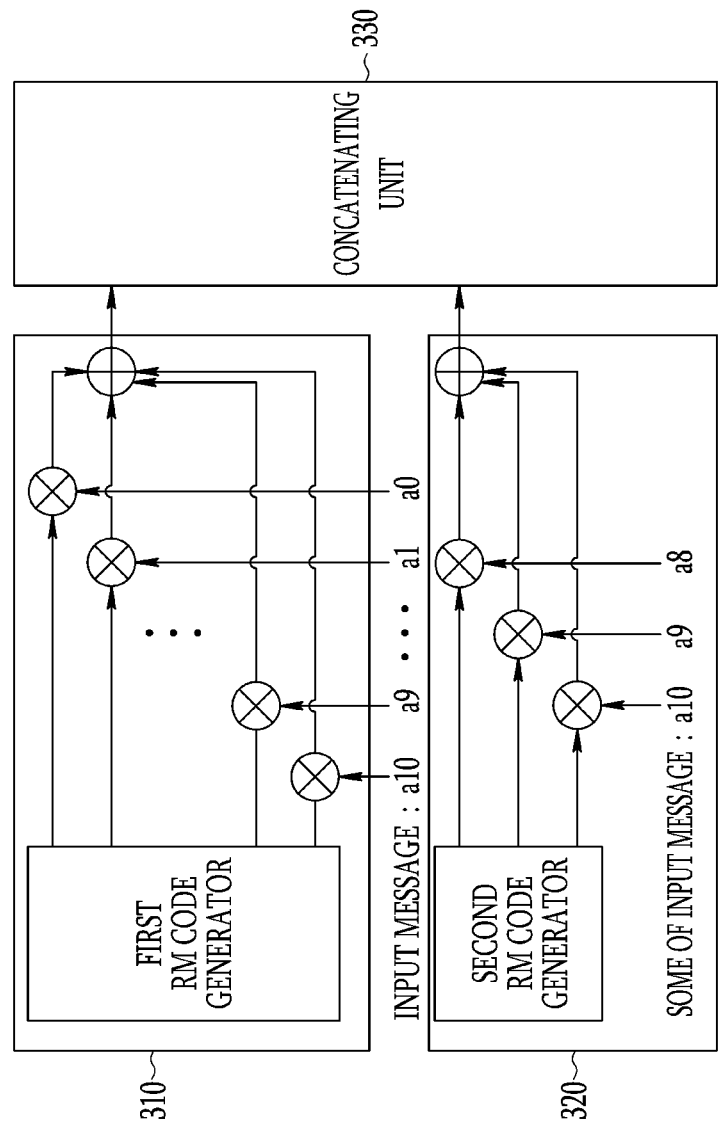
FIG. 3 is a block diagram illustrating an encoder according to an exemplary embodiment of the present invention.

Hereinafter, exemplary embodiments of the present invention will be described in detail with reference to the accompanying drawings so that those skilled in the art may easily practice the present invention. However, the present invention may be implemented in various different ways and is not limited to the exemplary embodiments provided in the present description. In the accompanying drawings, portions unrelated to the description will be omitted in order to obviously describe the present invention, and similar reference numerals will be used to describe similar portions throughout the present specification.

Throughout the specification, a terminal may refer to a mobile station (MS), a mobile terminal (MT), an advanced mobile station (AMS), a high reliability mobile station (HR-MS), a subscriber station (SS), a portable subscriber station (PSS), an access terminal (AT), a user equipment (UE), a machine type communication (MTC) device, and the like, and may include functions of all or some of the MT, MS, AMS, HR-MS, SS, PSS, AT, UE, and the like.

In addition, a base station (BS) may represent an advanced base station (ABS), a high reliability base station (HR-BS), a node B, an evolved node B (eNodeB), an access point (AP), a radio access station (RAS), a base transceiver station (BTS), a mobile multi-hop relay (MMR)-BS, a relay station (RS) serving as the base station, a relay node (RN) serving as the base station, an advanced relay station (ARS) serving as the base station, a high reliability relay station (HR-RS) serving as the base station, a small base station [femto base station (BS), a home node B (HNB), a home eNodeB (HeNB), a pico BS, a metro BS, a micro BS, or the like], or the like, and may include all or some of the functions of the ABS, the nodeB, the eNodeB, the AP, the RAS, the BTS, the MMR-BS, the RS, the RN, the ARS, the HR-RS, the small base station, and the like.

In a block code, a length of an output message may be variably operated, and for this purpose, a puncturing method may be used. In the puncturing method, all of additional information n−k of the output message is not transmitted, but the remaining portion except for a difference between a length of a final message and a length of a varied output message may be transmitted.

Alternatively, in the block code, a length of an input message may be variably operated, and for this purpose, a shortening method may be used. In the shortening method, the input message is adjusted to have the length which is less than k, and the remaining input message having the length which is less than k is set to 0 or a predefined value. Thereafter, the portion which is set to 0 or the predefined value is again removed from the final message output through the encoding.

Therefore, in the puncturing method and the shortening method, the maximum length of the output message is limited to n, or the maximum length of the input message is limited to k. In this case, a (n, k) block code for n and k (n, k) of the maximum value is first designed taking account of the length of the input/output message (or the output message) which is to be varied, and the puncturing method and the shortening method may be applied to the encoder and the decoder for the designed block code.

In this case, in order to design the block code capable of supporting a message having a variable length to obtain highest performance, the following two items may be considered. The (n, k) block code needs to have good performance (if possible, highest performance) for the input message of all possible lengths, and needs to have good performance for the output message of all possible lengths. That is, the (n, k) block code may need to have highest performance for the input/output message of all operated lengths as well as for (n, k) of the maximum value, if possible.

Since a Reed-Muller (RM) code has relatively excellent performance compared to other block codes, and simply implement the encoder and the decoder, it was widely utilized in an application field requiring a code having a variable input/output message length. A length of the output message of the Reed-Muller code may be indicated by power of two. Hereinafter, a (16, 10) Reed-Muller code will be described.

Since an output message of the (16, 10) Reed-Muller code has a length of $16(=2^4)$, the (16, 10) Reed-Muller code has four basic codes (v1, v2, v3, and v4). In this case, v1, v2, v3, and v4 are primary basic codes, which are also known as monomials of degree 1, and products between the four basic codes may also be the basic codes of the (16, 10) Reed-Muller code. That is, new basic codes may be generated based on the products between the four basic codes. There are secondary basic codes, which are also known as monomials of degree 2 (v1v2, v1v3, v1v4, v2v3, v2v4, and v3v4) represented by the product between two basic codes, tertiary basic codes, which are also known as monomials of degree 3 (v1v2v3, v1v2v4, v1v3v4, and v2v3v4) represented by the product between three basic codes, and a quaternary basic codes, which are also known as monomials of degree 4 (v1v2v3v4) represented by a product between four basic codes. Further, due to the characteristics of the Reed-Muller code, a code word in which all codes are 1 may be the basic code, which is referred to as a 1s code (a zeroth-order basic code, which is also known as monomial of degree 0) in the present description. Therefore, the (16, 10) Reed-Muller code has a total of $16(=4+6+4+1+1)$ basic codes, and the basic code may serve as a basic generation code for the encoder. The encoding may be performed by operation (an inner product under a modulo-2 operation) between an input message bit and the basic code having the same length as the input message bit. For example, when the input message has the length of 5 bits which are a0, a1, a2, a3, and a4, in the case in which five basic codes 1s, v1, v4, v3, and v4 which are arbitrarily selected are used as the basic codes for generating the code, a final codeword is expressed as in the following Equation 1.

$$a0*1s+a1*v1+a2*v3+a3*v3+a4*v4 \qquad [\text{Equation 1}]$$

Equation 1, all of plus (+) operations denote a binary operation. When the puncturing method is used, the output message output from the (16, 10) Reed-Muller code may be varied within a length of 16. When the shortening method is used, the input message which is to be input to the (16, 10) Reed-Muller code may be varied within a length of 10.

In this case, in order to design the (16, 10) Reed-Muller code, 10 basic codes of 16 basic codes may be selected. In this case, the 10 basic codes are selected to maximize performance of the Reed-Muller code. The performance of the block code may be determined by a hamming distance. The hamming distance indicates the number of different bits between two codes, and as the hamming distance is larger, the two codes are different codes which are dissimilar to each other. Therefore, in order to obtain good performance, the block code may be designed so that the hamming distance is large. In order to optimize of performance of the Reed-Muller code, the basic codes may be selected in order of the basic codes including a large number of 1. The following Equation 2 expresses the basic codes which are selected in order of the basic codes including a large number of 1.

$$\begin{aligned} 1 &= (1111111111111111) \\ v_4 &= (0000000011111111) \\ v_3 &= (0000111100001111) \\ v_2 &= (0011001100110011) \\ v_1 &= (0101010101010101) \\ v_3 v_4 &= (0000000000001111) \\ v_2 v_4 &= (0000000000110011) \\ v_1 v_4 &= (0000000001010101) \\ v_2 v_3 &= (0000001100000011) \\ v_1 v_3 &= (0000010100000101) \\ v_1 v_2 &= (0001000100010001) \end{aligned}$$ [Equation 2]

In order to output the output message having the variable length using the (16, 10) block code, in the case in which the output message having a length of n (n<16) is used, the remaining bits except for a portion of the length n of the output message having the length of 16 may be deleted (the puncturing method). In addition, in order to encode the input message having the variable length using the (16, 10) block code, an input message bit having a length of k (k<10) and a message including 10–k 0s may be used as an input for a block code encoder (the shortening method). In this case, in the case in which 10 bits of the output message are equal to the input message, the encoded message has an input message bit having a length of k in which 10–k 0 bits are deleted. In the conventional (16, 10) Reed-Muller code, 10 bits of the output message are entirely different from the input message, the entirety of the output message are transmitted as it is. It may be appreciated that this partially includes the shortening method in which the encoding is performed by concatenating 10–k 0 bits to the input message of k bits.

Meanwhile, a (16, 5) Reed-Muller code in which the maximum length of the output message is the same as described above, and the maximum length of the input message is 5 may be used. In the case in which the method described above is applied to the (16, 5) Reed-Muller code, since the maximum length of the input message is 5, 1's, v1, v2, v3 and v4 may be selected as five basic codes. Alternative, a (16, 7) Reed-Muller code in which the maximum length of the output message is the same as described above, and the maximum length of the input message is 7 may be used. In this case, since 7, which is the maximum length of the input message, is greater than a summation of the number of zeroth-order basic codes and the number of primary basic codes, and is smaller than the summation of the number of zeroth-order basic codes, the number of primary basic codes, and the number of secondary basic codes, two basic codes of the zeroth-order basic codes, the primary basic codes, and the secondary basic codes may be selected as a basic code collection for generating a code.

Since the minimum hamming distance of the (16, 10) Reed-Muller code is 4, and the minimum hamming distance of the (16, 5) Reed-Muller code is 8, performance of the (16, 5) Reed-Muller code is generally better than performance of the (16, 10) Reed-Muller code. Since a (16, 7) Reed-Muller code has the minimum hamming distance of 4, it exhibits performance similar to the (16, 10) Reed-Muller code. Meanwhile, the maximum hamming distance of a (16, 7) block code is 6. Therefore, it may not said that the (16, 7) Reed-Muller code described above has the highest performance.

In order to solve the above-mentioned problem, the (16, 7) block code is not designed by arbitrarily selecting two secondary basic codes of six secondary basic codes, but a method of finding two basic codes capable of obtaining the hamming distance which is equal to the hamming distance of 6, which is theoretically the maximum, or is closest thereto, may be used. However, in the method, which is a heuristic method, since a method of designing a block code is very complex and is not systematic, a difficulty of a code design is very high. Therefore, an optical basic code, which is known with respect to the output message having a specific length indicated by power of 2, is recited. FIG. 1 is a diagram illustrating a (32, A) Reed-Muller code. The (32, A) block code illustrated in FIG. 1 is an optimal basic code which is known with respect to an output message, which is power of 2 ($32=2^5$), and is adopted in a 3GPP ($3^{rd}$ Generation Partnership Project) standard.

In the present description, the (36, A) Reed-Muller code used for an input/output message having a variable length is designed as the optimal block code.

Since the length of the output message of the Reed-Muller code is indicated by power of 2, 28 bits puncturing (64−28=36) may be performed for a basic code of 64 bits of a (64, A) Reed-Muller code, in order to determine the (36, A) Reed-Muller code. In this case, the 28 bits to be punctured of the 64 bits of the (64, A) Reed-Muller code need to be predetermined. That is, in order to obtain a block code having maximum performance, the puncturing bits need to be determined so that the hamming distance becomes the maximum. In the case in which the puncturing bits are determined by the heuristic method, since locations of the puncturing bits are determined for the number of all cases, it may be complex and be inefficient. In particular, in the case in which A is a relatively large value, it may be more complex and be inefficient. In addition, in order to determine optimal A basic codes, since a complex calculation is required, it is difficult to efficiently design an optimal block code.

Alternatively, the (36, A) Reed-Muller code may be determined based on a (32, A) Reed-Muller code. That is, 14 bits are punctured from the (32, A) Reed-Muller code to generate a (18, A) code, and the (18, A) code is repeatedly transmitted twice, thereby making it possible to have the same performance as the (36, A) Reed-Muller code. However, since the Reed-Muller code determined by the above-mentioned method is not the optimal code having the highest performance, there is significant performance difference compared to the optimal code. In particular, there is a limit that a value of A needs to be less than or equal to 18.

FIG. 2 is a diagram illustrating a (36, A) Reed-Muller code according to an exemplary embodiment of the present invention.

Referring to FIG. 2, the (36, A) Reed-Muller code is designed by concatenating the (32, A) Reed-Muller code with a dual orthogonal code, which is a kind of Reed-Muller codes. That is, in order to generate the (36, A) block code, 4 bits may be additionally concatenated with the (32, A) Reed-Muller code, and in this case, the dual orthogonal code corresponding to the output 4 bits may be a (4, 3) code. Therefore, in the case in which the maximum length of the input message is 11, the hamming distance of 2 (the maximum hamming distance which may be obtained by the output of the added 4 bits) may be additionally obtained.

Since the length of the input message may also be varied, the code may need to maintain optimal performance even though the value of A in the code to be generated is changed. For example, the code illustrated in FIG. 2 needs to be appropriately changed so as to maintain the performance even in the case in which A is 8.

In the present description, performance of the code to be generated may be maintained by changing a location of the concatenated dual orthogonal code according to the varied value of A. For example, in the case in which A is 8, the (4, 3) dual orthogonal code is allocated to seventh, eighth, and ninth bits of the input message, and in the case in which A is 9, the (4, 3) dual orthogonal code is allocated to eighth, ninth, and tenth bits of the input message. That is, the (4, 3) dual orthogonal code is allocated to final three bits of the input message including A bits. In addition, in the case in which A is smaller than 3 (i.e., in the case in which the length of the input message is shorter than the length of the input message of the dual orthogonal code), the dual orthogonal code remaining after deleting a right column ((0, 0, 1, 1) or (0, 1, 0, 1)) of the dual orthogonal code is used for the encoding. For example, in the case in which A is 2, (1, 1, 1, 1) and (0, 0, 1, 1) are used, and in the case in which A is 1, only (1, 1, 1, 1) is used. Referring to FIG. 2, within the (32, A) Reed-Muller code, the location of the (4, 3) dual orthogonal code may be changed in an arrow direction.

According to an exemplary embodiment, a (35, A) Reed-Muller code may be generated by the concatenating of the (32, A) block code and the (4, 3) dual orthogonal code. In this case, the final bit of the basic code is deleted, and accordingly, the hamming distance of the (35, A) Reed-Muller code may become the maximum. That is, in the case in which a summation of the lengths of any Reed-Muller code and the concatenated dual orthogonal code is greater than the length of the output message, the code may be generated based on the puncturing (deleting the final bit of the basic code).

As described above, in order to design the optimal code having the output message of the length which is not power of 2, a first Reed-Muller code in which the length of the output message is $2^n$ (e.g., 32(n=5), which is $2^5$), and a second Reed-Muller code in which the length of the output message is $2^m$ (e.g., 4(m=2), which is $2^2$), are used, and in this case, m is smaller than n. In addition, a concatenating location of two Reed-Muller codes may also be changed according to the length of the input message. In this case, even though the location at which the second Reed-Muller code is concatenated in the first Reed-Muller code is changed according to the length of the input message, the first Reed-Muller code and the second Reed-Muller code may be independently separated from each other without having a correlation with each other.

FIG. 3 is a block diagram illustrating an encoder according to an exemplary embodiment of the present invention.

Referring to FIG. 3, an encoder 300 according to an exemplary embodiment includes a first encoder 310, a second encoder 320, and a concatenating unit 330.

The first encoder 310 includes a first Reed-Muller code generator, and the second encoder 320 includes a second Reed-Muller code generator. According to an exemplary embodiment, the first encoder 310 may encode the input message based on the Reed-Muller code (e.g., the (32, A) Reed-Muller code), and the second encoder 320 may encode the input message based on the dual orthogonal code (e.g., the (4, 3) dual orthogonal code). The first encoder 310 and the second encoder 320 each encode the input message and some of the input message, and the concatenating unit 330 concatenates output messages which are output from the first encoder 310 and the second encoder 320, respectively, to thereby generate a final output message.

Figure 4:
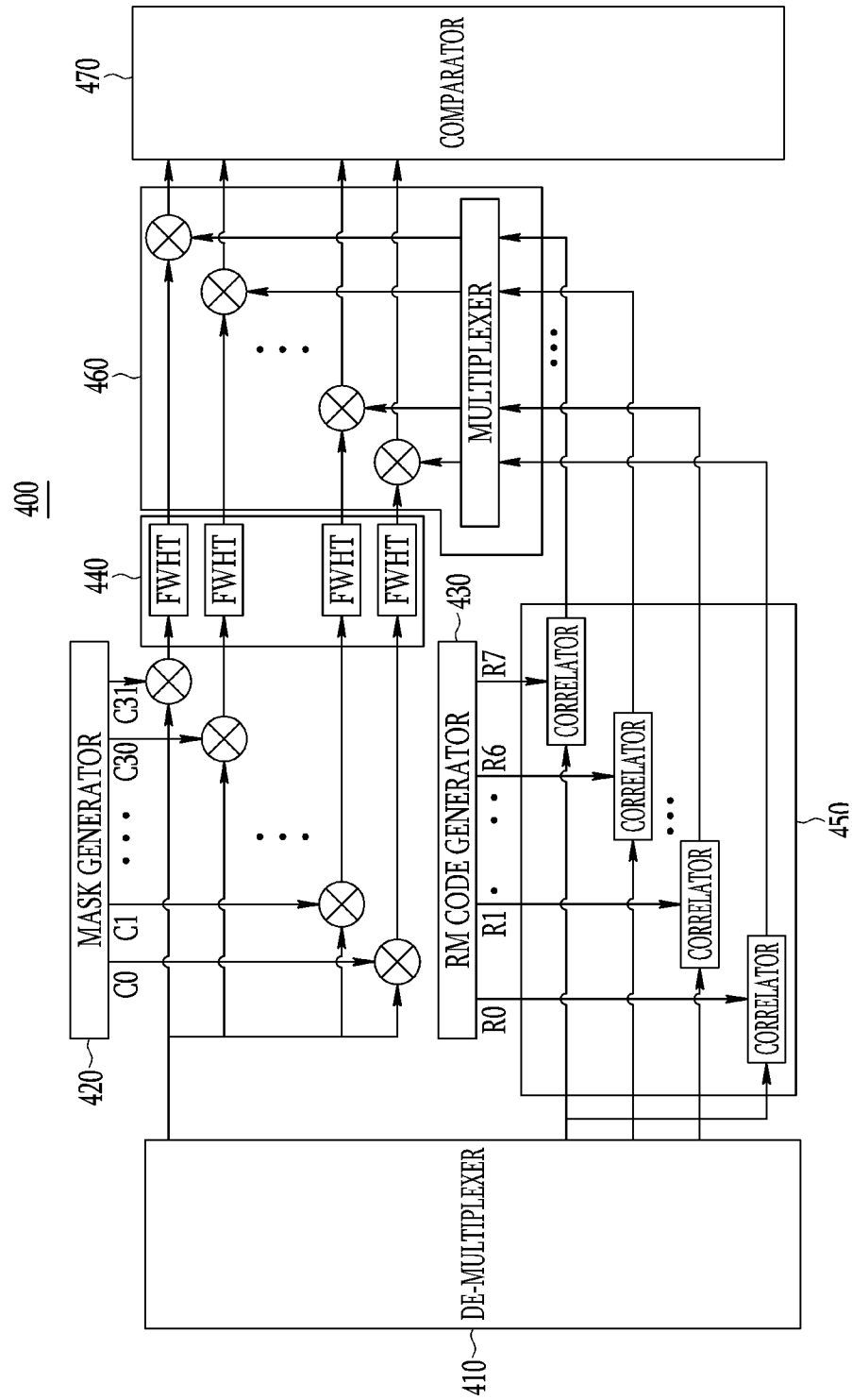
FIG. 4 is a block diagram illustrating a decoder according to an exemplary embodiment of the present invention.

FIG. 4 is a block diagram illustrating a decoder according to an exemplary embodiment of the present invention.

Referring to FIG. 4, a decoder 400 according to an exemplary embodiment includes a de-multiplexer 410, a mask generator 420, a Reed-Muller code generator 430, a fast Walsh-Hadamard transform (FWHT) unit 440, a correlator 450, a multiplexing (MUX) network 460, and a comparator 470. The FWHT unit 440 include a plurality of FWHT devices, the correlator 450 includes a plurality of correlators, and the MUX network 460 includes a multiplexer.

Since the dual orthogonal code has a form of ($2^n$, n+1), the dual orthogonal code may be applied to a case in which a value of A within the decoder 400 is smaller than n+1. Hereinafter, an operation of the decoder will be described with reference to a (36, A) block code which is generated by the concatenating of the (32, A) Reed-Muller code having the maximum value of A of 11 and the (4, 3) dual orthogonal code.

The (32, A) Reed-Muller code may use the FWHT in the case in which A is 6 bits (zeroth to fifth bits) or less. For example, in order to use the FWHT even in the case in which A is greater than 6 (A=11), a decoding for exceeded 5 bits (sixth, seventh, eighth, ninth, and tenth bits) of 11 bits is pre-performed. Referring to FIG. 4, the mask generator 420 generates a mask for removing an encoding for 32 messages corresponding to 5 bits (M6 to M10). That is, by multiplying the mask generated by the mask generator with the 32 messages corresponding to 5 bits, the decoding for the exceeded 5 bits of 11 bits is pre-performed.

Thereafter, the FWHT unit 440 performs a decoding for each branch (32(=$2^5$)) using the FWHT. In the case in which A is greater than 6 (in the case in which a received message is longer than a predefined length), since the decoding for the exceeded 5 bits (6 to 10) is pre-performed, a FWHT decoding may be performed at each branch. The final output at each branch is the maximum value among the outputs of the FWHT unit 440, and a bit value corresponding to the maximum value (a message bit of 6 bits for decoded zeroth to fifth bits).

If the (4, 3) dual orthogonal code is not used for the encoding of the received message, the decoder 400 selects the branch having the maximum output, and obtains a message bit of 5 bits (6 to 10) mapped to the selected branch. If the obtained message bit and the message bit of 6 bits (0 to 5) obtained through the FWHT decoding are concatenated, a decoded message bit of 11 bits is finally obtained. The decoder 400 selects only A bit from the message bit of 11 bits to thereby complete the decoding.

In the present description, since the (4, 3) dual orthogonal code is used for the encoding of the received message, only final four messages of the received message having the length of 36 are correlated independently with the (4, 3) dual orthogonal code. Therefore, the correlator 450 calculates a correlation value between the four messages correlated with the (4, 3) dual orthogonal code and eight codes originated from the (4, 3) dual orthogonal code. In this case, the calculation of the correlation value performed by the correlator 450 may be a kind of FWHT decoding.

Thereafter, the multiplexing network 460 adds the correlation value generated by the correlator 450 to the output of the FWHT unit 440 connected to a (32, A) branch to thereby generate output bits. The comparator 470 compares a plurality of output bits output from the multiplexing network 460 to thereby decode the received message. In this case, the multiplexing network 460 may control the value of A, a branch index, and an index for the output of the FWHT unit 440 in order to map the correlation value for the (4, 3) dual orthogonal code and the branch of the (32, A) decoder.

For example, in the case in which A is 9, the received message is decoded based on the (4, 3) dual orthogonal code, which may be additionally represented, of sixth, seventh, and eighth bits. Since 32 branches of the (32, A) decoder are generated for sixth to tenth bits (5 bits) of the input message, a correlation value for a code of 001 among the correlation values for the (4, 3) code output from the correlator 450 is added to a branch having sixth to tenth bits of 001xx.

As described above, in the case in which the optimal code having the maximum hamming distance is designed, since the encoder and the decoder of the first Reed-Muller code having the length of the existing output message of 2n which is optimally designed, and the encoder and the decoder of the second Reed-Muller having the length of the output message which is shorter than 2n may be utilized as it is, it is efficient.

Figure 5:
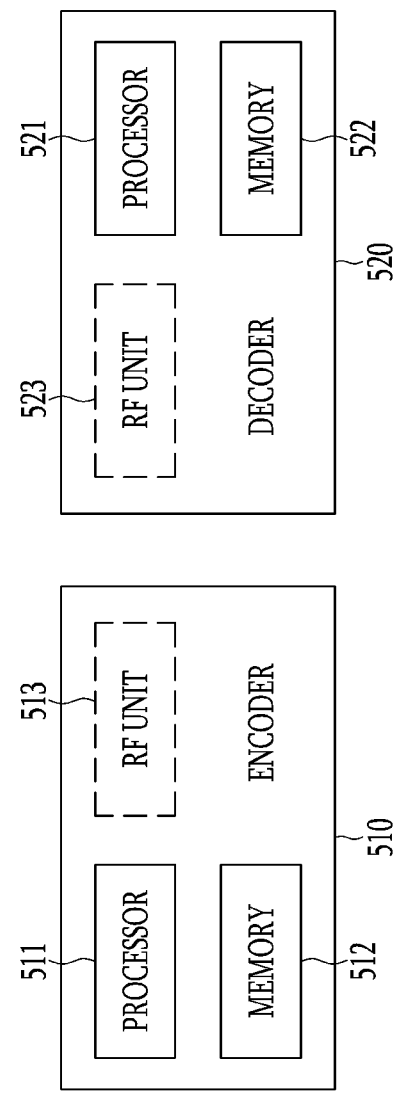
FIG. 5 is a block diagram illustrating an encoder and a decoder according to another exemplary embodiment of the present invention.

FIG. 5 is a block diagram illustrating an encoder and a decoder according to another exemplary embodiment of the present invention.

Referring to FIG. 5, an encoder 510 according to another exemplary embodiment includes a processor 511 and a memory 512. In addition, the encoder 510 may further include a radio frequency (RF) unit 513. The memory 512 may be connected to the processor 511 and may store a variety of information for driving the processor 511 or at least one program executed by the processor 511. The RF unit 513 may be connected to the processor 511, and may transmit and receive a RF signal. The processor 511 may implement the functions, the processes, or the methods proposed by the exemplary embodiments of the present disclosure. In this case, in the case in which the encoder 510 according to another exemplary embodiment of the present disclosure is included in a terminal or a base station of a wireless communication system, the processor 511 may implement a wireless interface protocol layer for wireless communication of the terminal or the base station. An operation of the encoder 510 according to another exemplary embodiment may be implemented by the processor 511.

Referring to FIG. 5, a decoder 520 according to another exemplary embodiment includes a processor 521 and a memory 512. In addition, the decoder 520 may further include a radio frequency (RF) unit 523. The memory 522 may be connected to the processor 521 and may store a variety of information for driving the processor 521 or at least one program executed by the processor 521. The RF unit 523 may be connected to the processor 521, and may transmit and receive a RF signal. The processor 521 may implement the functions, the processes, or the methods proposed by the exemplary embodiments of the present disclosure. In this case, in the case in which the decoder 520 according to another exemplary embodiment of the present disclosure is included in a terminal or a base station of a wireless communication system, the processor 521 may implement a wireless interface protocol layer for wireless communication of the terminal or the base station. An operation of the decoder 520 according to another exemplary embodiment may be implemented by the processor 521.

According to the exemplary embodiment of the present disclosure, the memory may be internal or external of the processor, and may be connected to the processor by various means which are already known. The memory is a variety of types of volatile or non-volatile storing medium. For example, the memory may include a read-only memory (ROM) or a random access memory (RAM).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A terminal transmitting an encoded message in a wireless communication network, the terminal comprising:
a processor and a memory, wherein the processor executes a program stored in the memory to perform
an operation of generating a first output message by encoding an input message based on a first block code,
an operation of generating a second output message by encoding some of the input message based on a second block code, and
an operation of transmitting the encoded message in which the first output message and the second output message are concatenated,
wherein the first block code is a block code having a length of an output message of $2^n$, and the second block code is a Reed-Muller code having a length of an output message of $2^m$, m being smaller than n.

2. The terminal of claim 1, wherein:
the block code having a length of an output message of $2^n$ is a (32, A) bcode of long term evolution (LTE) system, and the Reed-Muller code having a length of an output message of $2^m$ is a (4, 3) Reed-Muller code.

3. The terminal of claim 1, wherein:
the some of the input message is a portion corresponding to a length from a final bit of the input message to the input message of the second block code.

4. The terminal of claim 1, wherein:
when the processor performs the operation of generating the second output message, the processor performs
an operation of encoding the input message using some of the second block code, when a length of the input message is shorter than a length of an input message of the second block code.

5. The terminal of claim 4, wherein:
the some of the second block code is a dual orthogonal code which remains after deleting a right column of the second block code.

6. A method for transmitting an encoded message in a wireless communication network, the method comprising:
generating a first output message by encoding an input message based on a first block code,
generating a second output message by encoding some of the input message based on a second block code, and
transmitting the encoded message in which the first output message and the second output message are concatenated,
wherein the first block code is a block code having a length of an output message of $2^n$, and the second block code is a Reed-Muller code having a length of an output message of $2^m$, m being smaller than n.

7. The method of claim 6, wherein:
the block code having a length of an output message of $2^n$ is a (32, A) block code of long term evolution (LTE) system, and the Reed-Muller code having a length of an output message of $2^m$ is a (4, 3) Reed-Muller code.

8. The method of claim 6, wherein:
the some of the input message is a portion corresponding to a length from a final bit of the input message to the input message of the second block code.

9. The method of claim 6, wherein:
the generating of the second output message includes:
encoding the input message using some of the second block code, when a length of the input message is shorter than a length of an input message of the second block code.

10. The method of claim 9, wherein:
the some of the second block code is a dual orthogonal code which remains after deleting a right column of the second block code.

11. A terminal receiving a message to be decoded in a wireless communication network, the terminal comprising:
a processor and a memory, wherein the processor executes a program stored in the memory to perform
an operation of receiving the message,
an operation of generating a first output message by decoding the received message based on a fast Walsh-Hadamard transform (FWHT),
an operation of calculating a correlation value of a code originated from a dual orthogonal code and some of the received message, and
an operation of mapping the first output message and the correlation value.

12. The terminal of claim 11, wherein:
when the processor performs the operation of generating the first output message, the processor performs
an operation of applying the FWHT to branches having the number corresponding to bits exceeding a predefined length, when the received message is longer than the predefined length.

* * * * *